US010245686B2

(12) United States Patent
Warzyszynski et al.

(10) Patent No.: US 10,245,686 B2
(45) Date of Patent: *Apr. 2, 2019

(54) CONDITIONING METHOD OF GAS TURBINE ENGINE COMPONENTS FOR AERODYNAMIC NOISE REDUCTION

(71) Applicants: Mariusz Warzyszynski, Mississauga (CA); Jonathan Webster, Port Credit (CA)

(72) Inventors: Mariusz Warzyszynski, Mississauga (CA); Jonathan Webster, Port Credit (CA)

(73) Assignee: EnvAerospace Inc., Brampton (CA)

(*) Notice: Subject to any disclaimer, the term of this patent is extended or adjusted under 35 U.S.C. 154(b) by 62 days.

This patent is subject to a terminal disclaimer.

(21) Appl. No.: 15/342,648

(22) Filed: Nov. 3, 2016

(65) Prior Publication Data

US 2018/0117720 A1   May 3, 2018

(51) Int. Cl.
*B23P 15/02*   (2006.01)
*C23C 14/08*   (2006.01)
(Continued)

(52) U.S. Cl.
CPC ............ *B23P 15/02* (2013.01); *C23C 14/022* (2013.01); *C23C 14/028* (2013.01);
(Continued)

(58) Field of Classification Search
CPC ..... B23P 15/02; B08B 7/0035; C23C 14/028; C23C 14/083; C23C 14/14; C23C 14/022
See application file for complete search history.

(56) References Cited

U.S. PATENT DOCUMENTS 3,572,960 A    3/1971   McBride
4,199,295 A    4/1980   Raffy
(Continued)

OTHER PUBLICATIONS

Kind, R.J., Serjak, P.J., and Abbott, M.W.P., 1998, "Measurments and Prediction of the Effects of Surface Roughness on Profile Losses and Deviation in a Turbine Cascade", ASME Journal of Turbomachinery, vol. 120, pp. 20-27.
(Continued)

*Primary Examiner* — Moshe Wilensky

(57) ABSTRACT

The present invention relates to a conditioning method of gas turbine engine components (e.g. compressor blades and vanes) for aerodynamic noise reduction. The gas turbine engine components are plasma treated in a high vacuum environment to generally reach a surface roughness (Ra) below 150 nanometers and in some cases below 25 nanometers. Then during the same process the components are coated using either a metallic or ceramic, hard, thin coating ranging from 100 to 3000 nanometers in thickness depending on desired surface smoothness and non-fouling properties. The same treatment combined with a surface relaxation process, which is part of a smoothing process, allows applying even up to 100 micrometers of hard coating without changes to high cycle fatigue properties and overall performance. Improved surface smoothness of the components and enhanced non-adhesiveness of the contaminants advance the quality of the flow through the gas path and compressor aerodynamic noise reduction.

12 Claims, 19 Drawing Sheets

(51) Int. Cl.
*C23C 14/02* (2006.01)
*C23C 14/32* (2006.01)
*F01D 5/00* (2006.01)

(52) U.S. Cl.
CPC .......... *C23C 14/083* (2013.01); *C23C 14/325* (2013.01); *F01D 5/00* (2013.01); *F05D 2240/30* (2013.01); *Y02T 50/6765* (2018.05)

(56) References Cited

U.S. PATENT DOCUMENTS

| | | | |
|---|---|---|---|
| 4,454,740 A | 6/1984 | Neal | |
| 5,529,671 A | 6/1996 | Debley | |
| 5,868,860 A | 2/1999 | Asplund | |
| 6,309,738 B1 * | 10/2001 | Sakurai | C23C 14/0641 407/119 |
| 6,375,790 B1 | 5/2002 | Fenner | |
| 6,394,108 B1 | 5/2002 | Butler | |
| 6,517,688 B2 | 2/2003 | Sakurai | |
| 6,576,067 B2 | 6/2003 | Spitsberg | |
| 8,118,561 B2 | 2/2012 | Bruce | |
| 8,479,754 B2 | 7/2013 | Hjerpe | |
| 8,673,400 B2 | 3/2014 | Kirby | |
| 8,764,515 B2 | 7/2014 | Rizzo, Jr. | |

OTHER PUBLICATIONS

Suder, K.L., Chima, R.V., Strazisar, A.J. and Roberts, W.B., 1994 "The Effect of Adding Roughness and Thickness to a Transonic Axial Compressor Rotor".

Zwebek, A.I., 2002, "Combined Cycle Performance Deterioration Analysis" (PHD Thesis), Cranfield.

Frost, F., Fechner, R., Ziberi, B., Vollner, D., Flamm, D. and Schindler, A., 2009, "Large Area Smoothing of Surfaces by Ion Bombardment:Fundamentals and Applications", Journal of Physics: Condensed Matter, 21.

* cited by examiner

CONDITIONING METHOD OF GAS TURBINE ENGINE COMPONENTS FOR AERODYNAMIC NOISE REDUCTION

BACKGROUND OF THE INVENTION

The present invention relates to a conditioning method of gas turbine engine components for aerodynamic noise reduction, more particularly a method of reducing the surface roughness of blades and vanes of a turbine engine compressor to a level that allows for a change in air flow characteristics and creates aerodynamic noise reduction.

Gas turbine engines are not only used as aircraft engines but also as aero derivative engines. For example industrial engines extensively used in industrial service, marine and land transportation. Aero and ground-based engines are built with many similar components.

One of the sections of a gas turbine engines is a compressor. The compressor delivers compressed air to a combustion chamber. Fuel mixed with compressed air is burned and transformed into a massive volume of gasses. These gasses expand and flow through the stator and rotor blades of the turbine converting produced energy to its kinetic equivalent, thrust or rotation.

Higher compressor pressures and temperatures can allow for greater efficiencies unfortunately with a higher noise level. The pressures and temperatures are limited by the characteristics of materials. Noise level is dependent on the quality of the flow through the gas path.

Among others the aerodynamic performance relies on surface roughness of the compressor elements. Especially, but not limited to blades and vanes, surface roughness can be the result of deposition, erosion, or surface finish and causes friction and profile losses.

Pertinence of the surface roughness for compressor turbine blade and vane airfoils has been proven through extensive research and the results are published, for example in Kind, R. J., Serjak, P. J., and Abbott, M. W. P., 1998, "Measurements and Prediction of the Effects of Surface Roughness on Profile Losses and Deviation in a Turbine Cascade", ASME Journal of Turbomachinery, Vol. 120, pp. 20-27.

Generally, flow in the compressor is inherently unstable, turbulent and fully three-dimensional regardless of the inlet flow type: subsonic, supersonic or in some cases transonic. Depending on the blade design along the curved profile the flow may be laminar, transitional or turbulent; the flow characterizes the boundary layers. Quality of the flow is more important on the suction, lower pressure side of the airfoil.

Laminar flow formed near the leading edge defines the laminar boundary layer. Influence of the surface roughness on this layer is limited.

Turbulent flow which may be of low, medium and high intensity, defines the turbulent boundary layer. Presence of turbulence is required to create higher pressure, compared to an identical laminar flow system.

The transition flow is located between the two aforementioned types of flow; it defines the transition boundary layer. In this region the separation bubble appears and reattaches.

A lot of controversy surrounded the effect of turbulence in the early days. It concerned the creation of a separation bubble, its reattachment and effect on turbulence creation. Regardless of the controversies, the latest results proved the existence of a reduced loss level with lower surface roughness.

The aerodynamic noise reduction credit from improved surface smoothness depends on conditions in the regions where the airfoils have to work; it is especially derived from Mach and Reynolds numbers based on inlet velocity, the blade chord and the kinematic viscosity.

Compressor fouling obtained from deposition of foreign particles can induce separation of the boundary layer that results in unexpected pressures on the blade and vane airfoil surfaces and thus produce, according to Zwebek, A. I., 2002, "Combined Cycle Performance Deterioration Analysis" (PhD Thesis), Cranfield, vibration and noise. This problem is seldom improved during regularly scheduled maintenance intervals.

Engine washing is used to reduce unwanted residuals, a number of the techniques are presented in U.S. Pat. Nos. 5,868,860; 6,394,108 and 8,479,754.

Noise reduction methods not involving blade and vane airfoils surface conditioning are published in U.S. Pat. Nos. 3,572,960 and in 4,199,295.

Deterioration associated with profile losses of blade and vane airfoil resultant from impact and erosion damage is postponed by applying a hard coating using techniques like: physical vapor deposition (PVD), chemical vapor deposition (CVD) and high velocity oxygen fuel thermal spraying (HVOF) described in U.S. Pat. No. 8,118,561. Unfortunately these kinds of coatings are not the best solution for aerodynamic noise reduction. Recommended coating thickness of 25 μm results in a 4% loss of pressure ratio as pointed out in Suder, K. L., Chima, R. V., Strazisar, A. J. and Roberts, W. B., 1994, "The Effect of Adding Roughness and Thickness to a Transonic Axial Compressor Rotor", prepared for the $39^{th}$ international Gas Turbine and Aeroengine Congress and Exposition sponsored by the American Society of Mechanical Engineers, The Hague, Netherlands, Jun. 13-16, 1994.

Surface roughness profile (Ra) of blades and vanes achieved during the manufacturing process such as casting, forging or machining varies between 10 and 0.8 μm. Surface properties improvement process such as peening applied after these processes may smooth the surface down to Ra 0.4 μm as disclosed in U.S. Pat. No. 4,454,740. Hand polishing, tumbling with abrasive media or electrochemical machining (ECM) may lower Ra down to 0.2 μm. ECM process presented in U.S. Pat. No. 8,764,515 reaches 0.025 μm. Unfortunately ECM is not environmentally friendly. Electrolytes used in this process are mixtures of hydrofluoric acid (HF), hydrochloric acid (HCl) and sulfuric acid ($H_2SO_4$). The mixture also may cause corrosion.

Processes like polishing, tumbling, vibro-lapping and electro-polishing used for surface improvement of hard, environmental barrier coated components are demonstrated in U.S. Pat. No. 6,576,067. This fabrication method allows achieving a surface roughness (Ra) of 3 μm. Another method, exploring slurry application in U.S. Pat. No. 8,673,400 permits a decrease only to 40 μm.

Other present advanced machining and finishing processes, for instance electron-beam or laser machining, are not able to accomplish better results. Of course high vacuum plasma etching technology offers some solutions like arc cathode smoothing presented in U.S. Pat. No. 6,517,688 where surface finish (Ra) of 1.5 μm was obtained. Alternatively, ion beam polishing in U.S. Pat. No. 5,529,671 where only 20 nm is removed from the substrate. A smoothing example of low initial surface roughness (Ra), 10 nm, is U.S. Pat. No. 6,375,790 where a gas cluster ion beam is used for microelectronic materials. In this field and as well in conventional, micro and nano optics, magnetic storage technology, semiconductor technology and analytical techniques plasma etching is used wisely. A good illustration of those applications is publication of Frost, F., Fechner, R., Ziberi, B., Völlner, D., Flamm, D. and Schindler, A., 2009, "Large area smoothing of surfaces by ion bombardment: fundamentals and applications", Journal of Physics: Condensed Matter, 21.

What is needed for the application presented above is a method which can harness high quality surface finishing technology such as plasma etching and transform it into a technology which addresses the flow issue by enhancing blade and vane airfoil smoothness which in turn reduces aerodynamic noise.

BRIEF SUMMARY OF THE INVENTION

It is the objective of this invention to provide a method which allows for conditioning of gas turbine engine components (e.g. compressor blades and vanes) in order to reduce aerodynamic noise.

The present invention improves surface smoothness of the blade and vane airfoils, this lowers friction between them and the air flow and decreases the fouling effect. An additional layer of metal oxide, nitride, carbide or carbonitride increases repellency, effectively decreasing deposition tendency and protecting against erosion.

The specified method deals with initial surface roughness (Ra) of blade and vane airfoils varying from 3000 to 300 nm. The full conditioning process is divided in two main segments: surface preparation and ion conditioning.

The disclosed surface preparation includes traditional finishing until the surface roughness (Ra) reaches a maximum 250 nm and a washing process that prepares components for further ion conditioning.

The present method offers an ion conditioning process executed in a high vacuum chamber and comprises a maximum of 6 stages: glow discharge cleaning, arc discharge cleaning, direct smoothing, surface glancing, surface relaxation and coating. Which stages are used depends on contamination, material and required final state of the substrate.

The final effect of the invention is the aerodynamic noise reduction of gas turbine engine components.

BRIEF DESCRIPTION OF THE SEVERAL VIEWS OF THE DRAWINGS

The present invention will be thoroughly described by referencing the accompanying drawings, wherein.

DETAILED DESCRIPTION OF THE INVENTION

The present invention employs a conditioning method of gas turbine engine components (e.g. compressor blades and vanes) for reducing aerodynamic noise.

Figure 1:
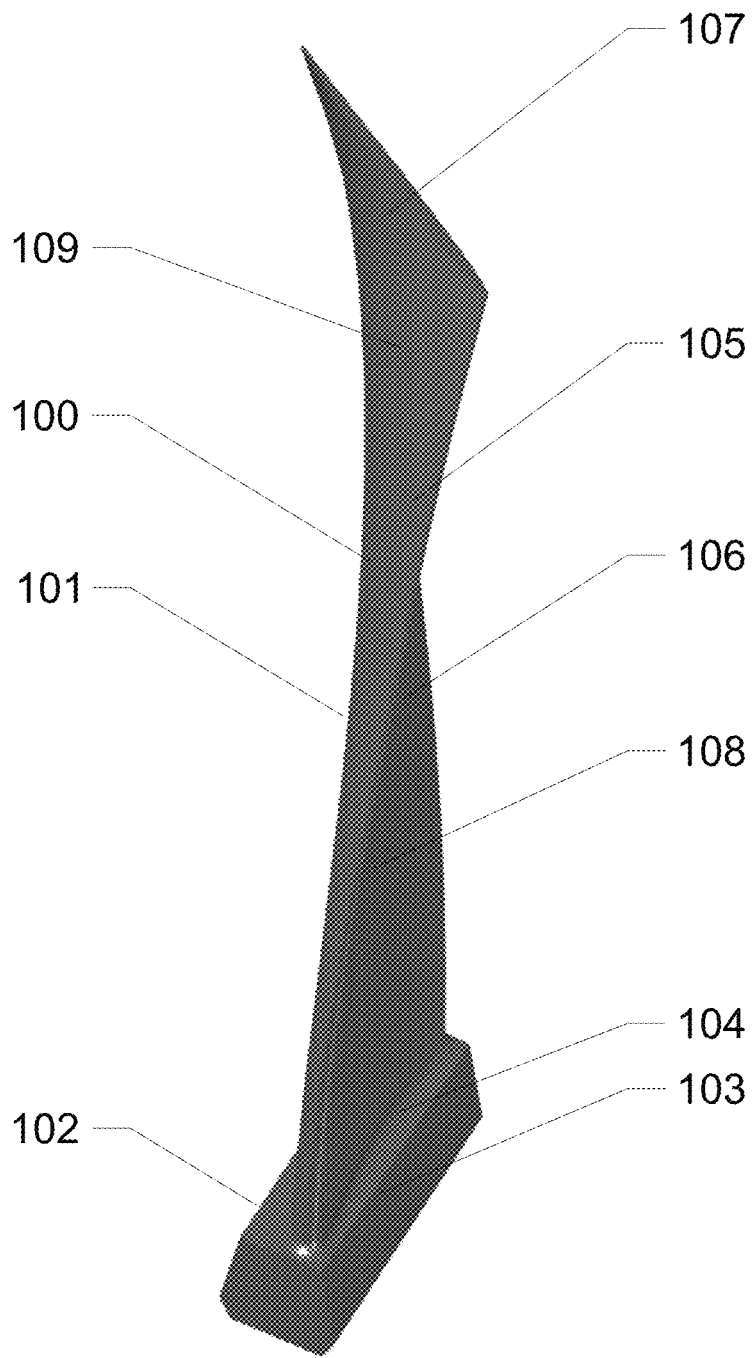
FIG. 1 is a perspective view of a compressor blade which is conditioned according to the method of the invention.

FIG. 1 shows a blade 100 of a gas turbine engine compressor. The blade is one of the components of the conditioning procedure. Each blade employs a base 101 and an airfoil 102. The base 101 comprises a dovetail root 103 and a platform 104. The airfoil 102 contains a leading edge 105, a trailing edge 106 and a profile tip 107. The airfoil 102 has two sides: concave-pressure side 108 and convex-suction side 109. High velocity air flow across the curved blade and vane profile, particularly on the suction side 109, forms a laminar boundary layer near the leading edge 105, downstream but prior to the trailing edge 106 it develops into a turbulent boundary layer. The nature of changes in the boundary layers through-out the profile, influence proper usage of energy in the compressor.

The compressor blades are manufactured by casting, forging or machining. Commonly used materials for the blades are titanium alloys such as Ti6Al4V and Ti6Al2Sn4Zr2Mo, martensitic stainless steel GTD-450, iron alloy A286 and nickel alloy IN718.

Figure 2:
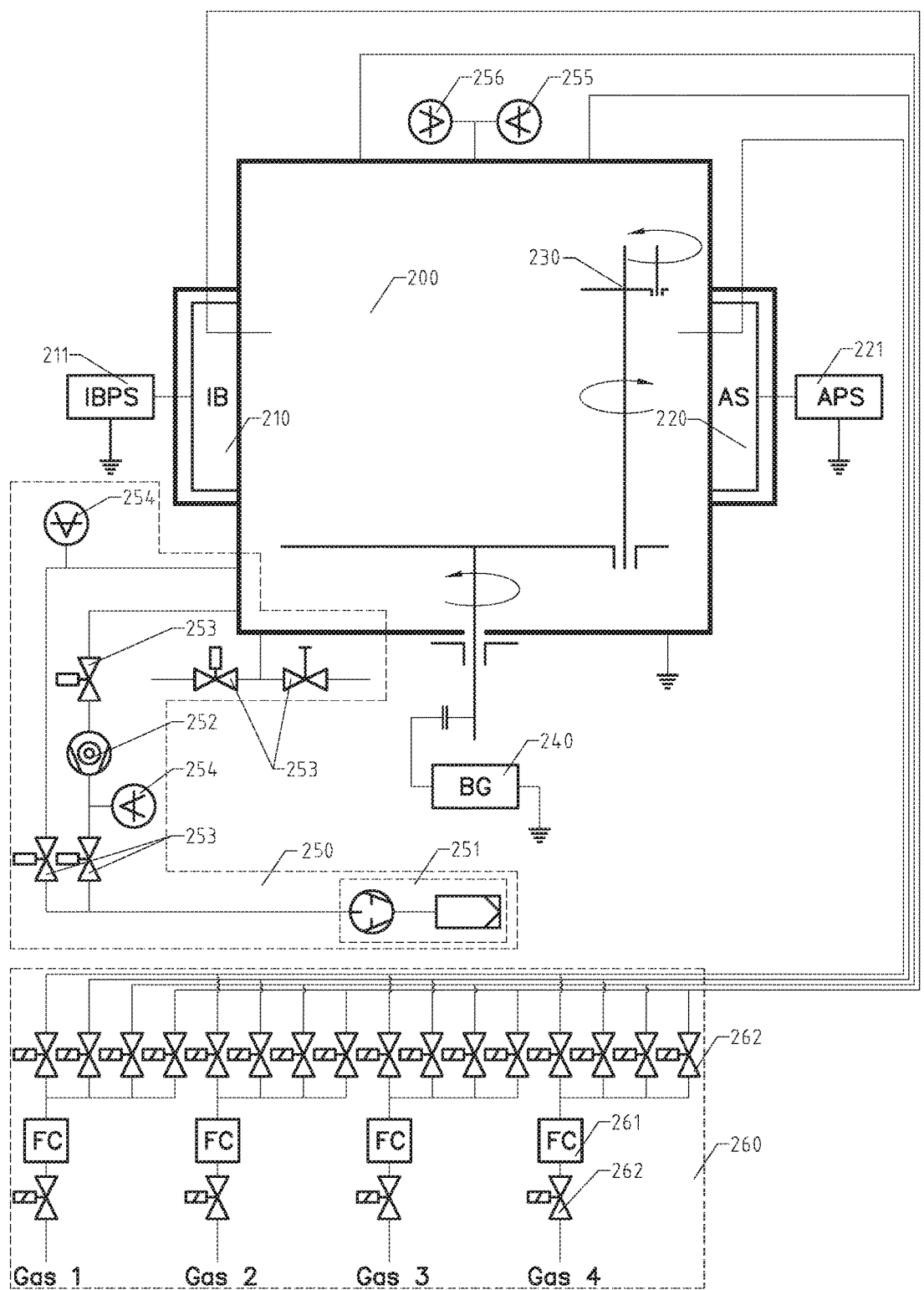
FIG. 2 is a schematic diagram of conditioning system configuration.

Configuration of an apparatus used to condition gas turbine engine components is presented in FIG. 2. An essential part of the system is a vacuum processing chamber 200 with an ion beam (IB) 210 and cathodic arc source (AS) 220. The ion beam 210 and the cathodic arc source 220 are powered by an ion beam power supply (IBPS) 211 and an arc power supply (APS) 221. The ion beam 210 is used for surface smoothing purposes and the cathodic arc source 220 for cleaning and potential coating options. Inside the vacuum processing chamber 200 a substrate holding device 230 is assembled. A bias generator (BG) 240 is connected to the substrate holding device 230. The chamber 200 is evacuated by the evacuation system 250 with a mechanical booster 251, turbomolecular pump 252 and controlled by a set of vacuum valves 253 and vacuum sensors: a pirani gauge 254, a cold cathode gauge 255 and a baratron capacitance manometer 256. Configuration of the apparatus is finalized with: a gas supply system 260 with flow controllers (FC) 261 and set of flow control valves 262.

The conditioning method of turbine engine components deals with a wide range of initial surface roughness (Ra) of blade and vane airfoils, depending on the component material and method of manufacturing. It may vary from 3000 to 300 nm. To fully control the process the surface of the component has to be checked and assigned to a recommended stage. The process is divided in two main segments: surface preparation and ion conditioning.

The first segment of surface preparation contains two stages: surface finishing and surface cleaning. The airfoil surface receives a traditional finishing treatment until it reaches a maximum surface roughness (Ra) 250 nm. Then it is washed, for example, in an ultrasonic cleaner to prepare the components for further ion conditioning.

The second segment of surface preparation-ion conditioning comprises of the following stages: glow discharge cleaning, arc discharge cleaning, direct smoothing, surface glancing, surface relaxation and coating.

Glow discharge cleaning is provided in a vacuum environment at a pressure between 3 to 8 Pa with presence of Ar, Kr or Xe and bias voltage between 200 to 600 V, process time 5 to 30 min. The process removes contamination caused mostly by oxides.

Arc discharge cleaning is implemented in a vacuum environment using a cathodic arc source with the current adjusted between 25 and 250 A, at a pressure between 0.1 to 0.3 Pa with attendance of Ar, and bias voltage from 500 to 1000 V, process time 1 to 5 s. The procedure eliminates water vapor and hydrocarbons.

Direct smoothing is the next stage of ion conditioning delivered at a pressure between 0.01 and 0.1 Pa with the presence of Ar, Kr or Xe, ion energy 100 to 1000 eV, ion current density from 100 to 200 $\mu A/cm^2$ and ion incidence angle 0° levels the biggest differences between peek to valley heights.

Surface glancing proceeds at a pressure between 0.01 and 0.1 Pa with presence of Ar, Kr or Xe, ion energy 500 to 5000 eV, ion current density from 100 to 300 $\mu A/cm^2$ and ion incidence angle from 30° to 85° smooth the component surface up to Ra 25 nm.

Surface relaxation progressed at a pressure between 0.01 and 0.1 Pa with the presence of Ar, Kr or Xe, substrate temperature from 373 to 673 K, ion energy 25 to 100 eV, ion current density from 100 to 200 $\mu A/cm_2$ and ion incidence angle 0° is a final stage of the conditioning which glances the element surface to nearly Ra 5 nm.

If necessary or desired a coating layer or a multilayer may be applied for preservation of the component surface properties as well to improve surface repellency. In this circumstance up to 3000 nm thick aluminum, chromium, titanium or zirconium oxides, nitrides, carbides or carbo-nitrides may be used.

Figure 3:
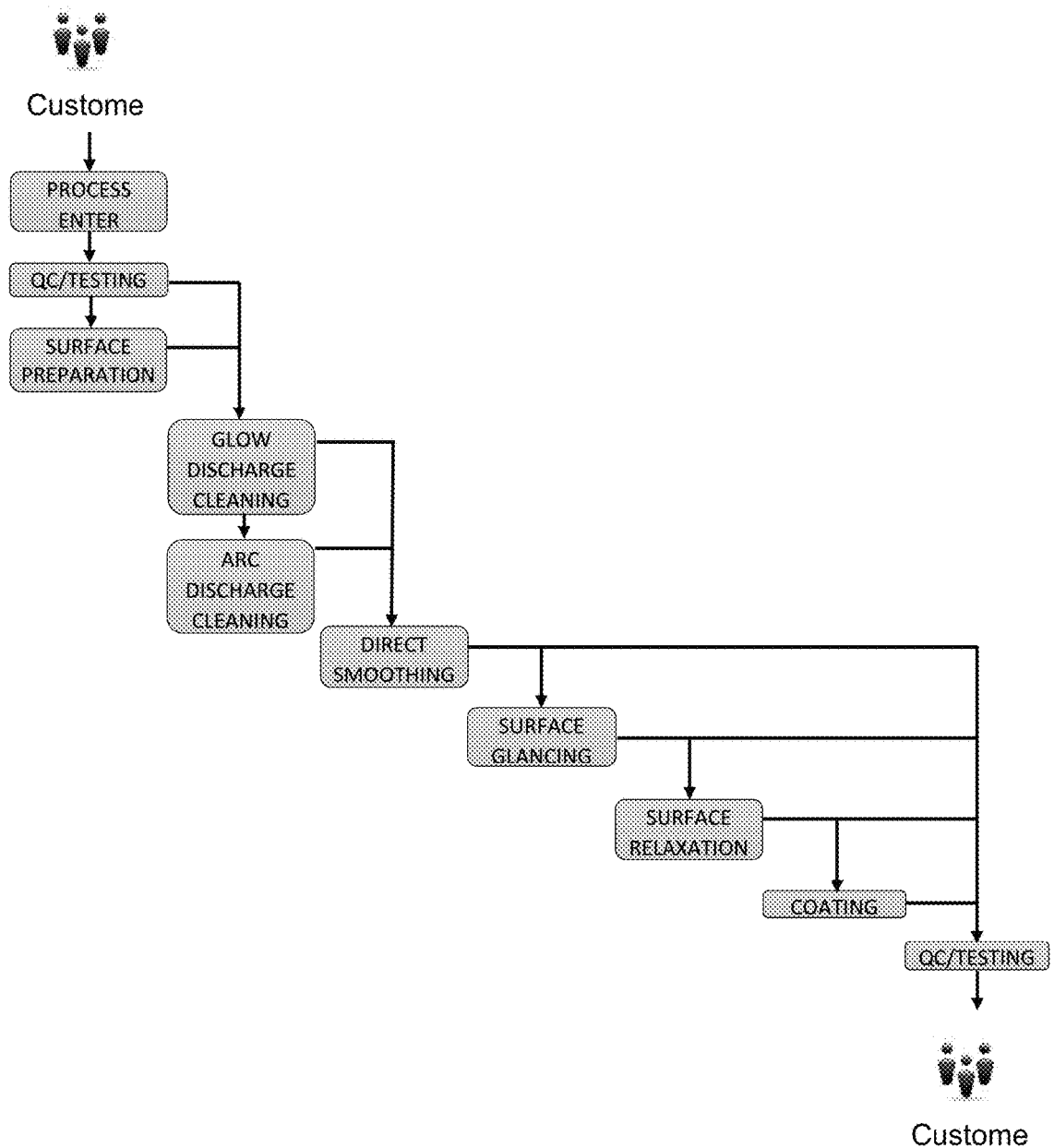
FIG. 3 is a flow chart indicating stages of the conditioning process of blades and vanes.

The flow chart presented on FIG. 3 demonstrates all the stages of the conditioning process. Not all the stages of the conditioning process have to be used to obtain satisfactory results. In some cases order of the application process can be changed.

In view of the wide range of the materials used for gas turbine engine blade and vane production different conditioning process recipes have to be used. Parameters of the procedure are usually in the presented limits.

The components may require for different coatings to be applied: anti-erosion, anti-corrosion and others with increasing fuel efficiency assets, then the final product involves the conditioning process. Depending on the applied coating thickness and requested parameters of the component surface intermediate conditioning may be recommended.

Investigation leading up to the invention of the conditioning method improving surface smoothness of turbine engine components were based on a group of examinations of the surface roughness of tested Ti6Al4V specimens. Some of the surface roughness specimens' results are presented in FIG. 4 to FIG. 6.

Figure 4:
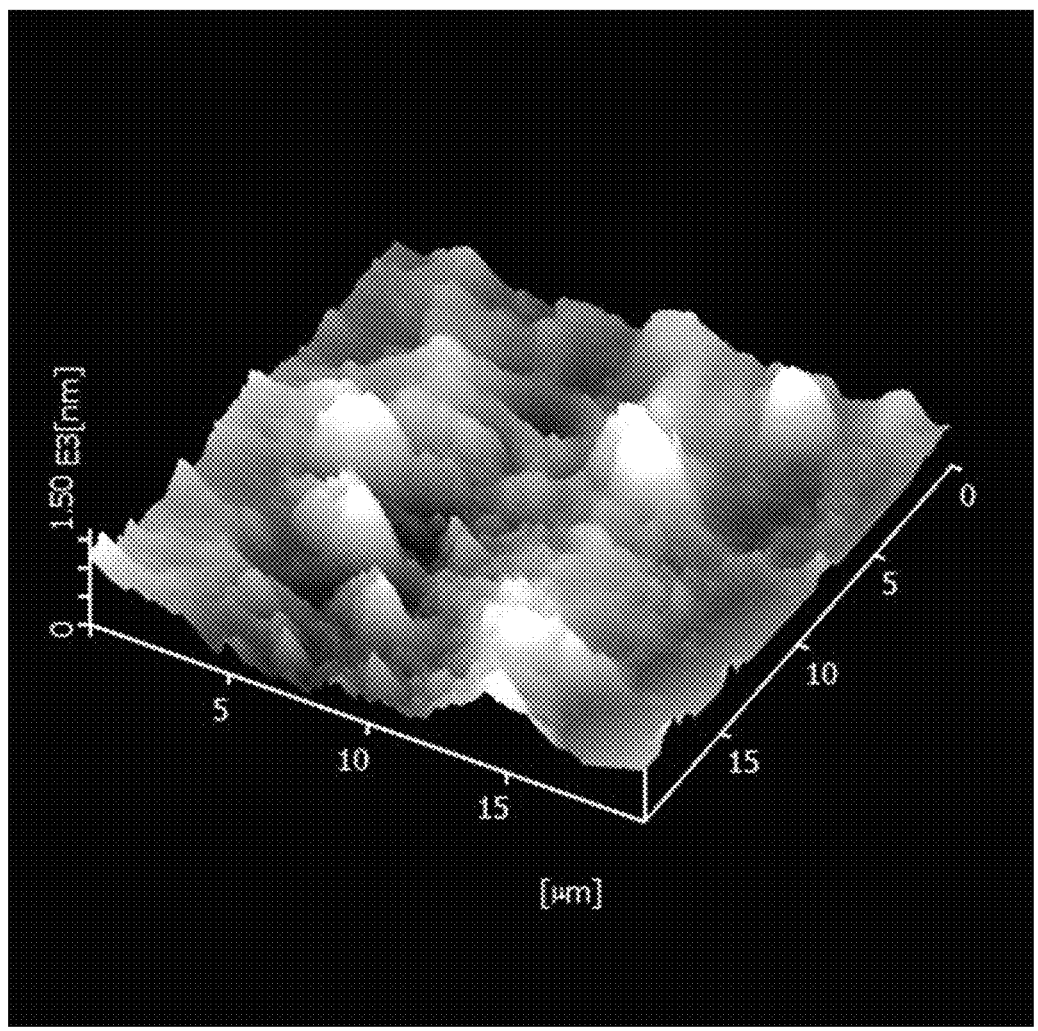
FIG. 4 is an atomic force microscope 3-dimensional surface representation of Ti6Al4V specimen before conditioning. Demonstrated surface roughness (Ra) 147 nm and maximum peak to valley height P-V 1473 nm.
Figure 5:
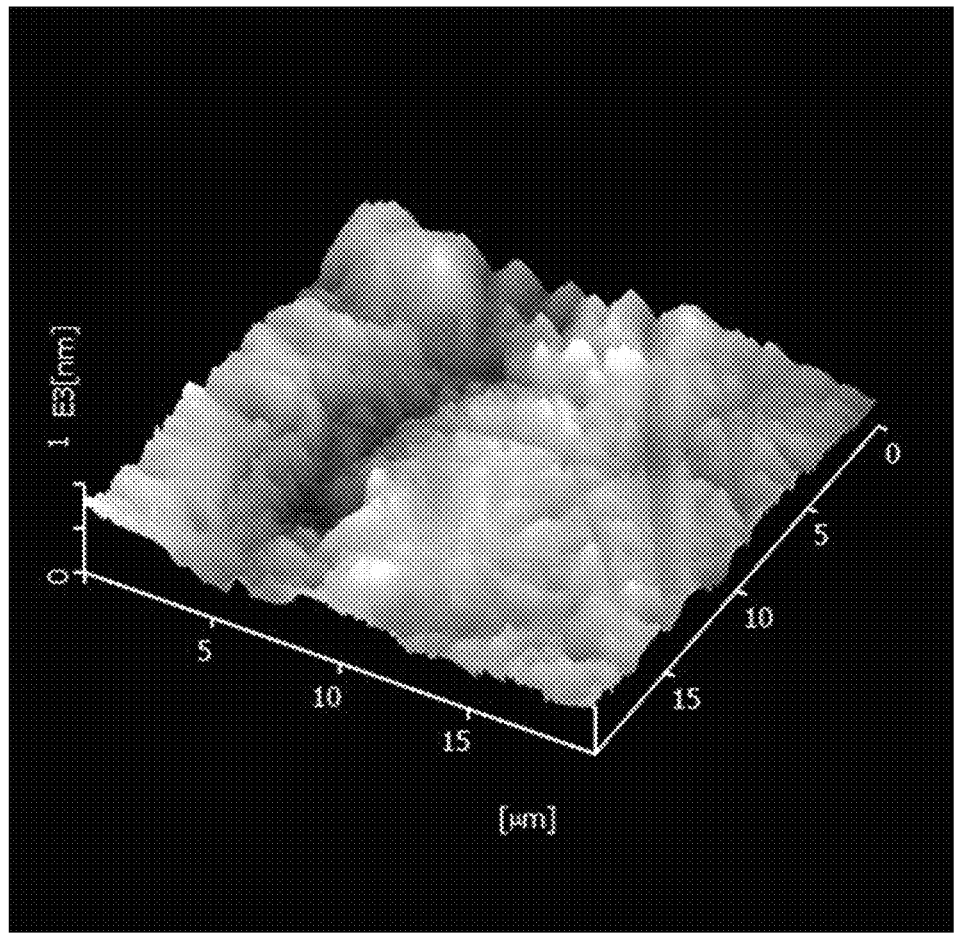
FIG. 5 is an atomic force microscope 3-dimensional surface representation of Ti6Al4V specimen after second phase of conditioning. Demonstrated surface roughness (Ra) 55 nm and maximum peak to valley height P-V 68 nm.
Figure 6:
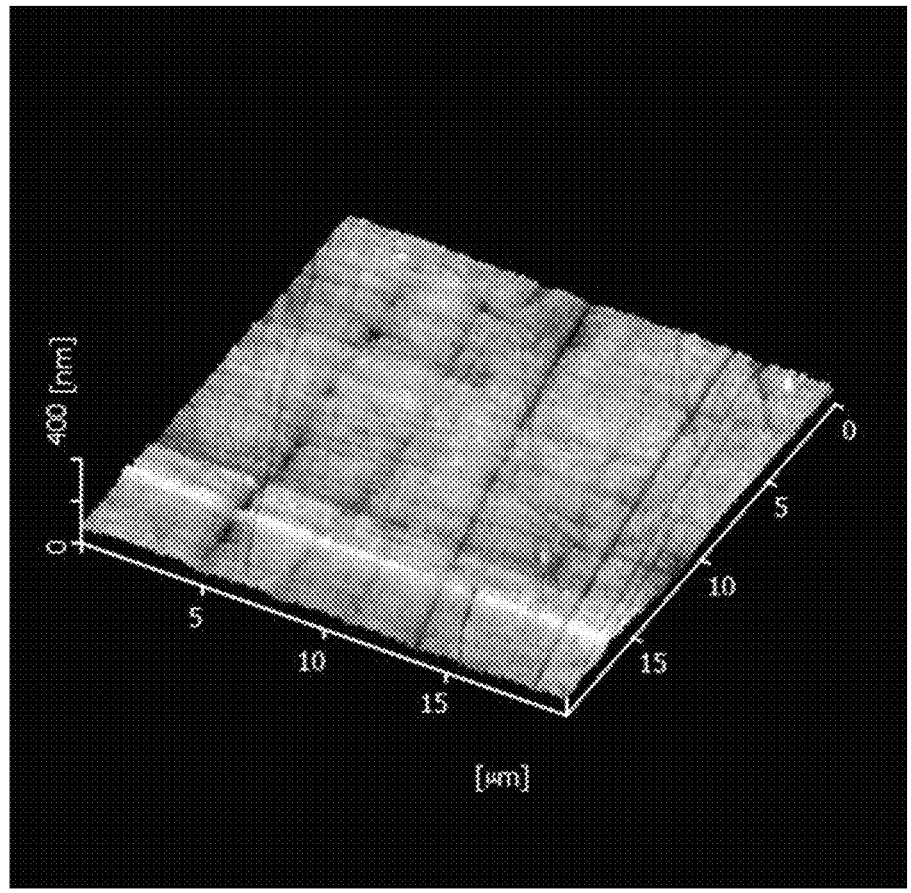
FIG. 6 is an atomic force microscope 3-dimensional surface representation of Ti6Al4V specimen after the final phase of conditioning. Demonstrated surface roughness (Ra) 7 nm and maximum peak to valley height P-V 8 nm.

As shown on the chart in FIG. 3, all samples that have a surface roughness (Ra) higher than 250 nm have to go through a surface preparation stage which includes standard mechanical polishing. FIG. 4 is the illustration, prepared on an atomic force microscope, of a sample ready for ion conditioning. The sample Ra parameter is equal 143 nm and maximum peak to valley height P-V 1473 nm. In FIG. 5 the substrate post surface glancing is presented. Increase of the surface smoothness (Ra) is noticeable and equals 55 nm, and maximum peak to valley height P-V 68 nm. The final picture in this section FIG. 6 demonstrates effects of a full conditioning process; the surface roughness (Ra) reaches 7 nm and maximum peak to valley height P-V 8 nm.

The further results of the invention are illustrated on FIG. 7 to FIG. 18. According to the invention the conditioning process protects the component against fouling effect, which leads to airfoil profile losses and increasing specific fuel consumption. On a drop shape analyzer a repellency test was conducted. Repellency is quantified in relations to a contact angle between applied liquid which may occur in turbine engine compressor and Ti6Al4V specimen surface. A higher contact angle number represents higher repellency properties.

Figure 7:
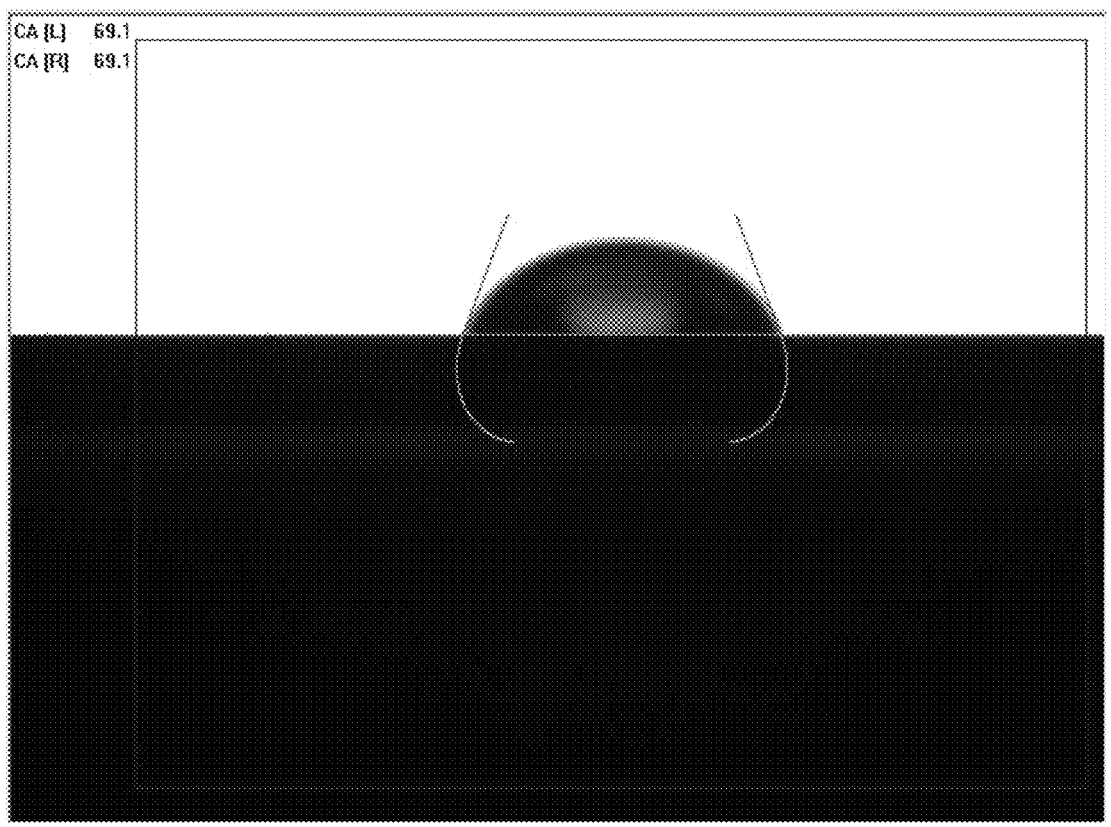
FIG. 7 is a drop shape analyzer illustration of the contact angle between a rain water droplet and untreated Ti6Al4V specimen surface.
Figure 8:
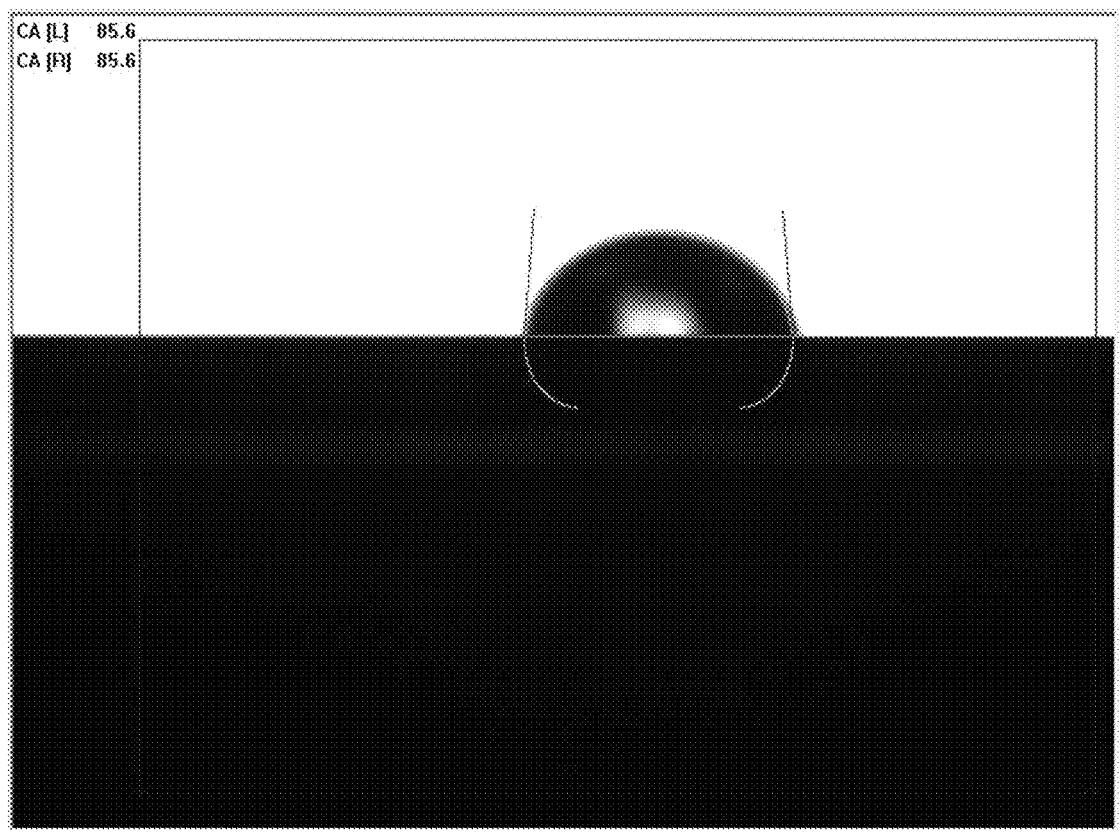
FIG. 8 is a drop shape analyzer illustration of the contact angle between a rain water droplet and conditioned Ti6Al4V specimen surface.
Figure 9:
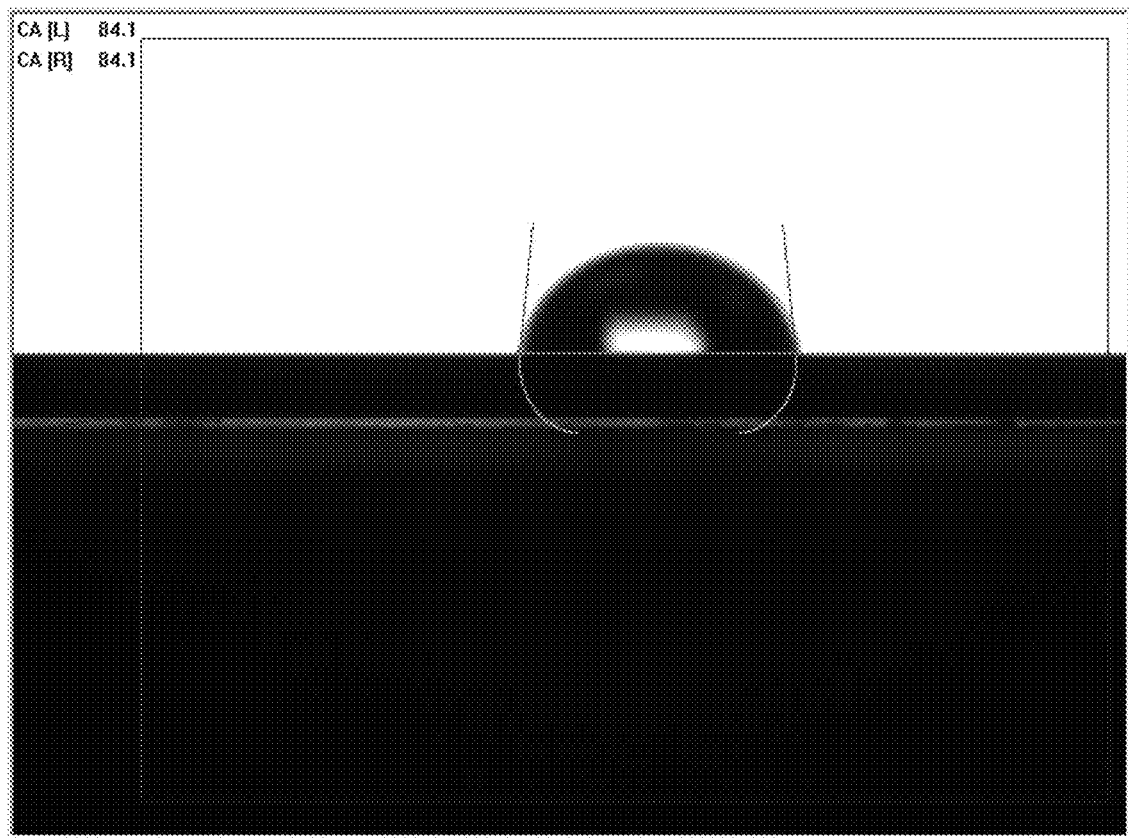
FIG. 9 is a drop shape analyzer illustration of the contact angle between a rain water droplet and conditioned, 100 nm metal oxide coated Ti6Al4V specimen surface.

In FIG. 7 the contact angle between a rain water droplet and untreated Ti6Al4V specimen surface is demonstrated and equals 69.1°. The contact angle between rain water droplet on the conditioned Ti6Al4V specimen surface in FIG. 8 matches 85.6°. The same angle between the rain water droplet and conditioned, 100 nm metal oxide coated Ti6Al4V specimen surface presented in FIG. 9 ties 84.1°.

Figure 10:
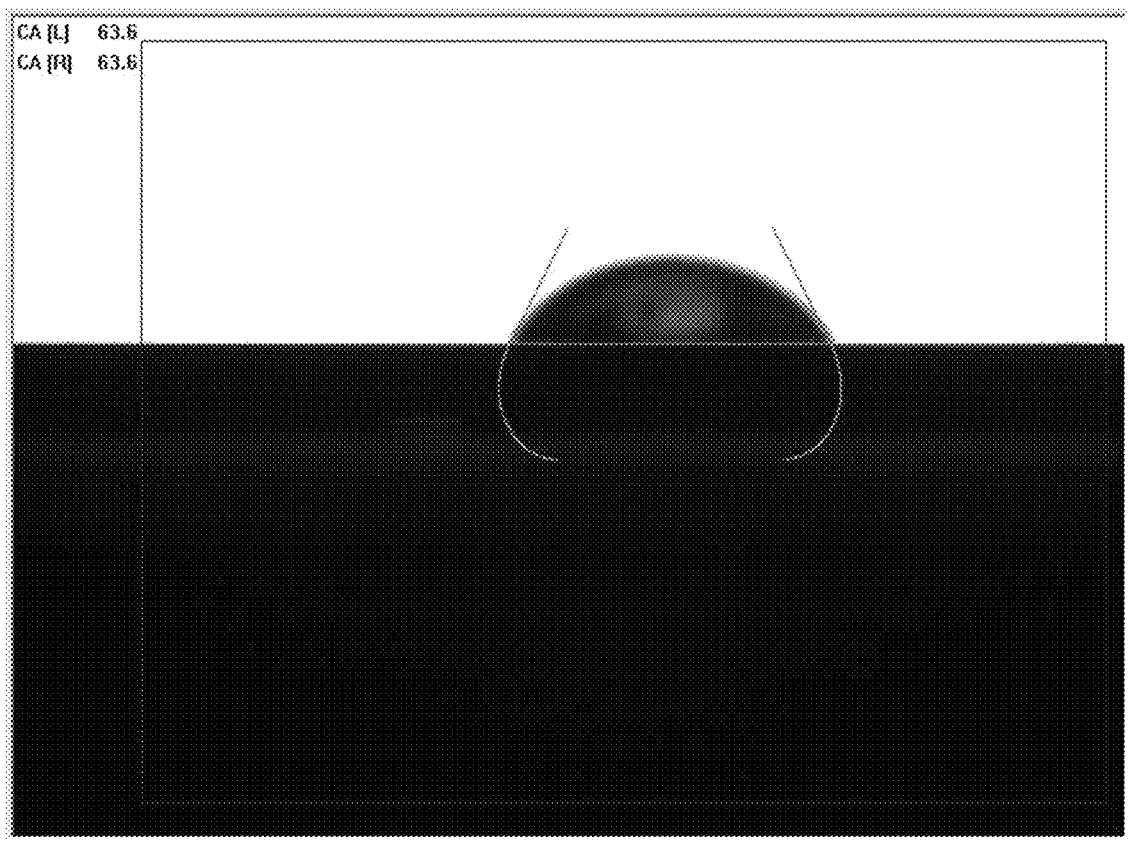
FIG. 10 is a drop shape analyzer illustration of the contact angle between a 3.5% saline water droplet and untreated Ti6Al4V specimen surface.
Figure 11:
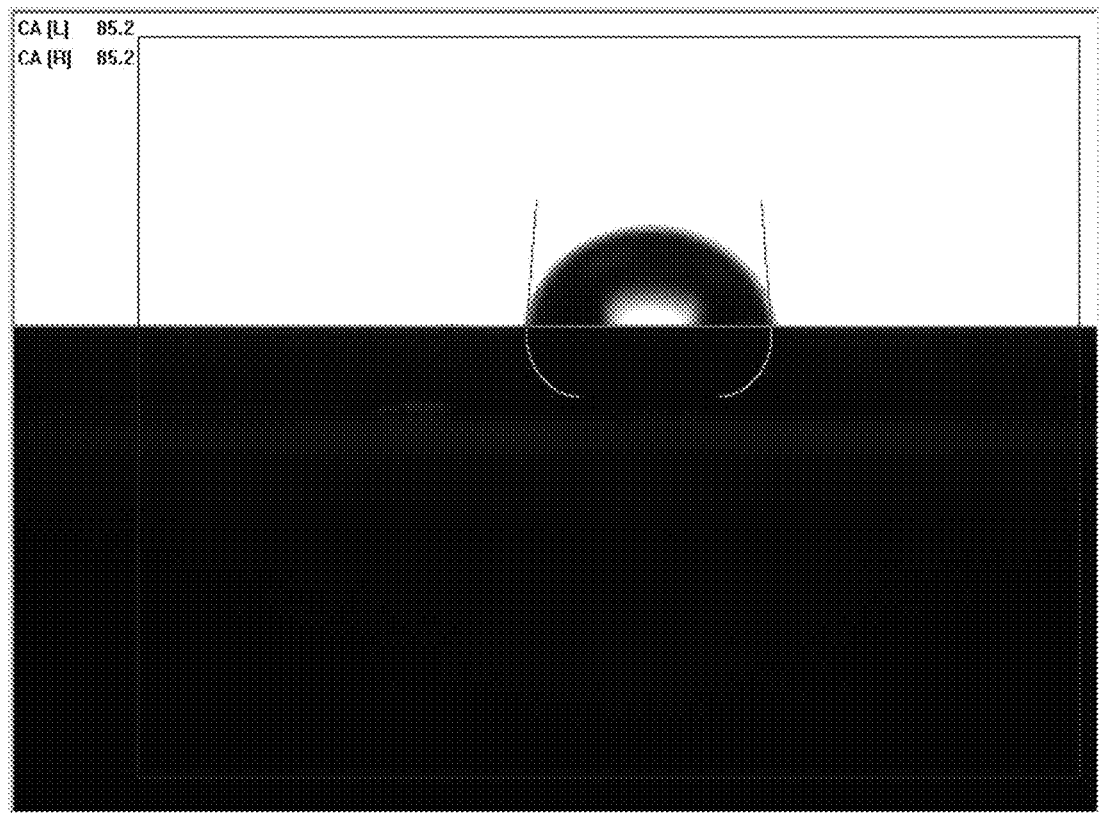
FIG. 11 is a drop shape analyzer illustration of the contact angle between a 3.5% saline water droplet and conditioned Ti6Al4V specimen surface.
Figure 12:
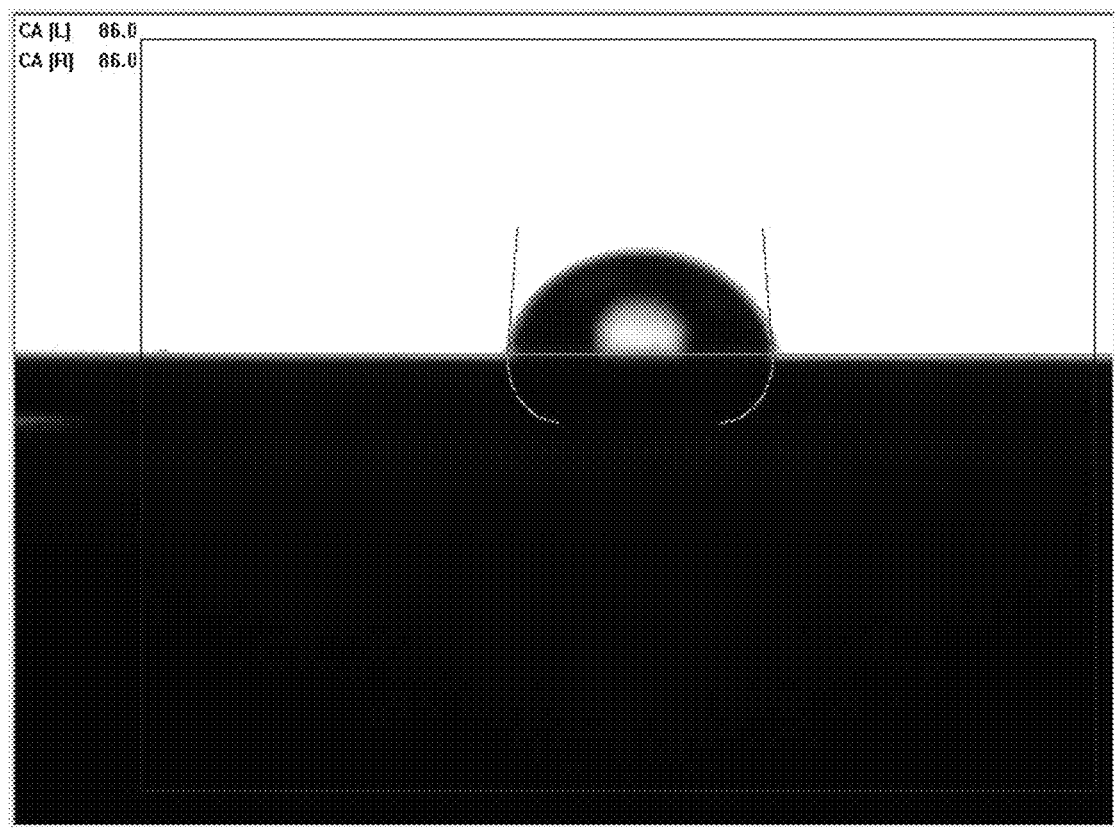
FIG. 12 is a drop shape analyzer illustration of the contact angle between a 3.5% saline droplet and conditioned, 100 nm metal oxide coated Ti6Al4V specimen surface.

FIG. 10 shows the contact angle between a 3.5% saline water droplet and untreated Ti6Al4V specimen surface of 63.6°. The angle between a 3.5% saline water droplet and conditioned Ti6Al4V specimen surface illustrated in FIG. 11 equals 85.2°. Furthermore the angle between a 3.5% saline water droplet and conditioned, 100 nm metal oxide coated Ti6Al4V specimen surface, demonstrated in FIG. 12, matches 86.0°.

Figure 13:
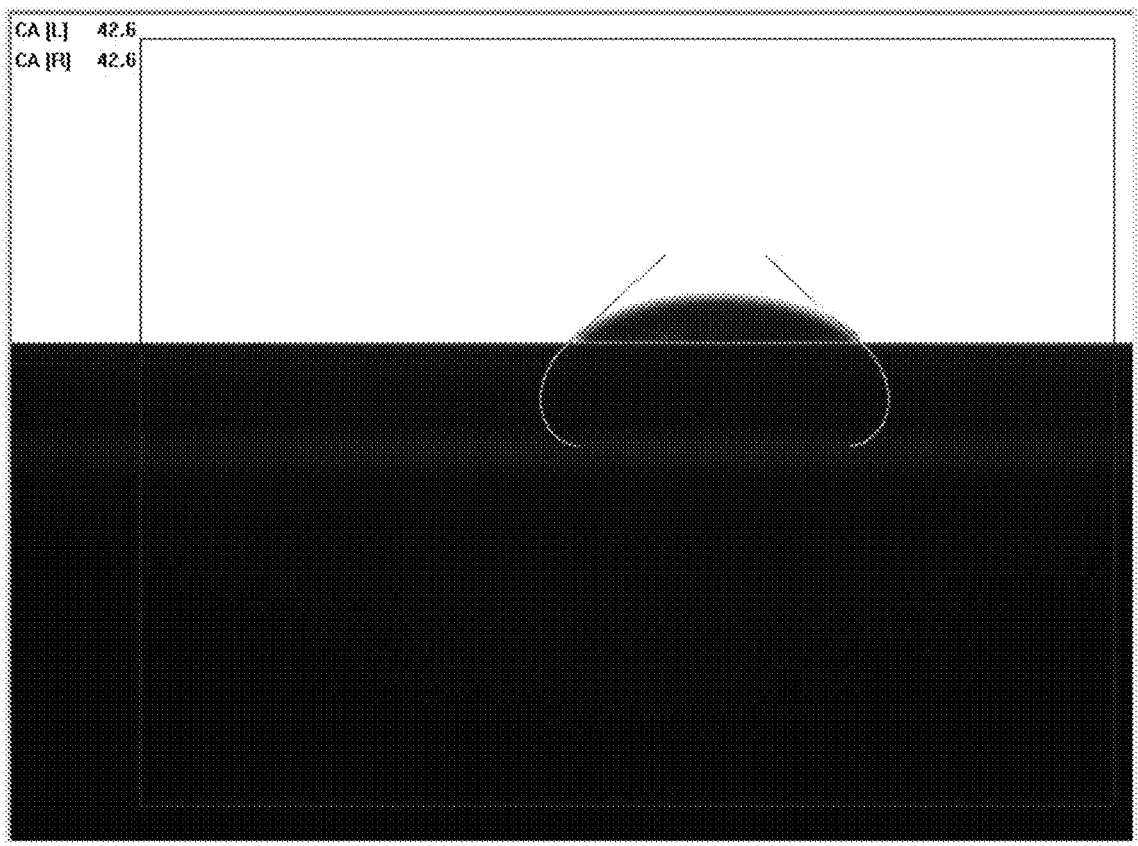
FIG. 13 is a drop shape analyzer illustration of the contact angle between a jet wash detergent droplet and untreated Ti6Al4V specimen surface.
Figure 14:
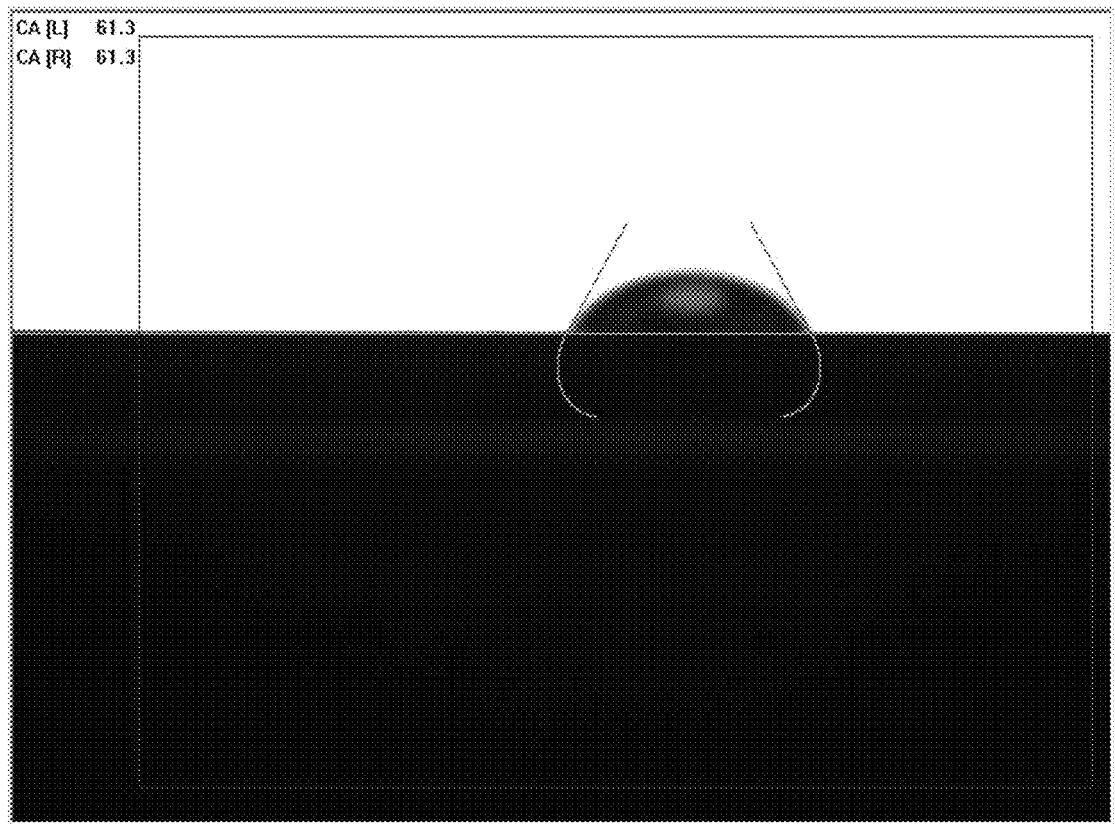
FIG. 14 is a drop shape analyzer illustration of the contact angle between a jet wash detergent droplet and conditioned Ti6Al4V specimen surface.
Figure 15:
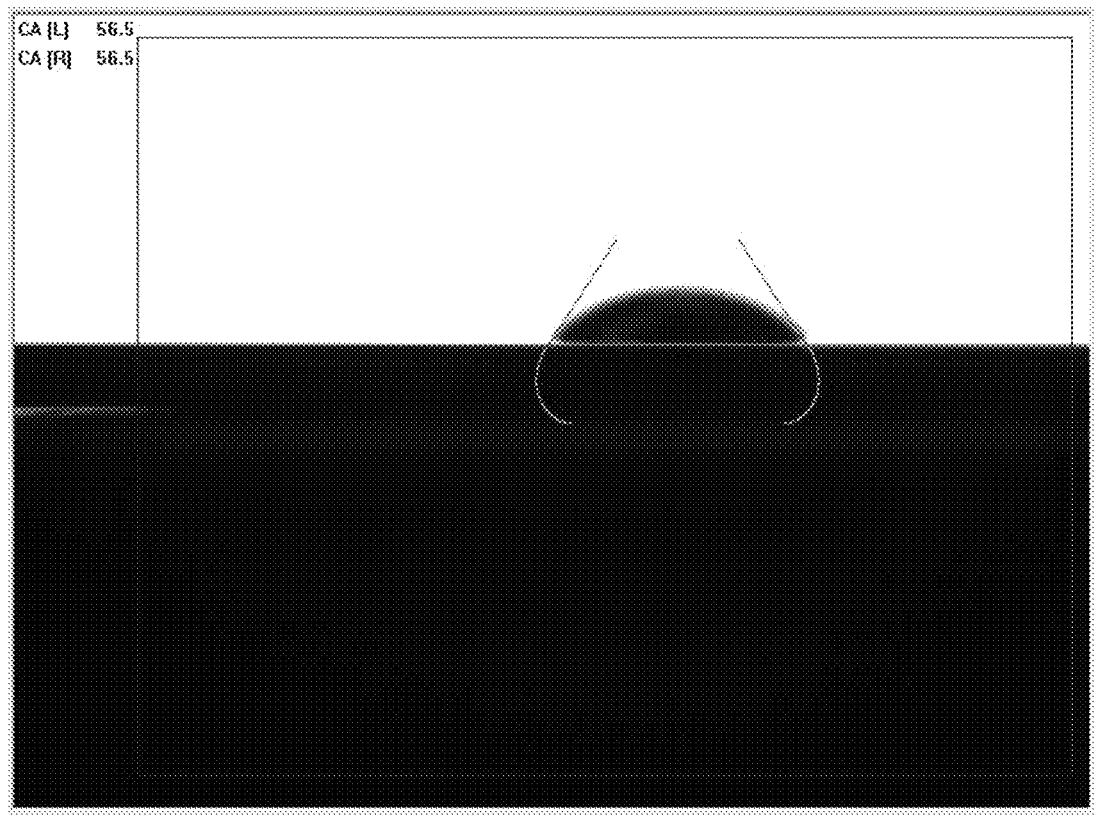
FIG. 15 is a drop shape analyzer illustration of the contact angle between a jet wash detergent droplet and conditioned, 100 nm metal oxide coated Ti6Al4V specimen surface.

Jet wash detergent and untreated Ti6Al4V specimen surface contact angle, in FIG. 13 equals 42.6°. The same angle between jet wash detergent and conditioned Ti6Al4V specimen surface, in FIG. 14, ties 61.3°. Measured on the conditioned, 100 nm metal oxide coated Ti6Al4V specimen surface, presented in FIG. 15, matches 56.5°.

Figure 16:
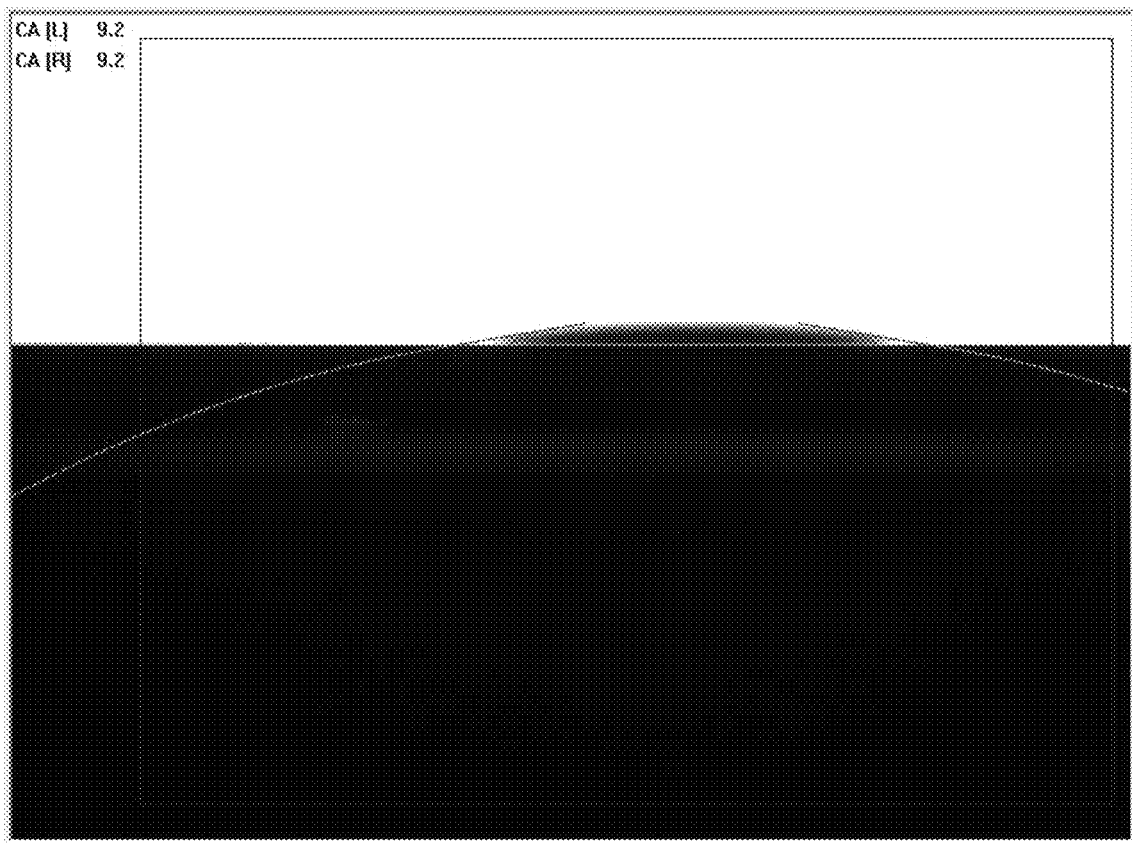
FIG. 16 is a drop shape analyzer illustration of the contact angle between a jet fuel droplet and untreated Ti6Al4V specimen surface.
Figure 17:
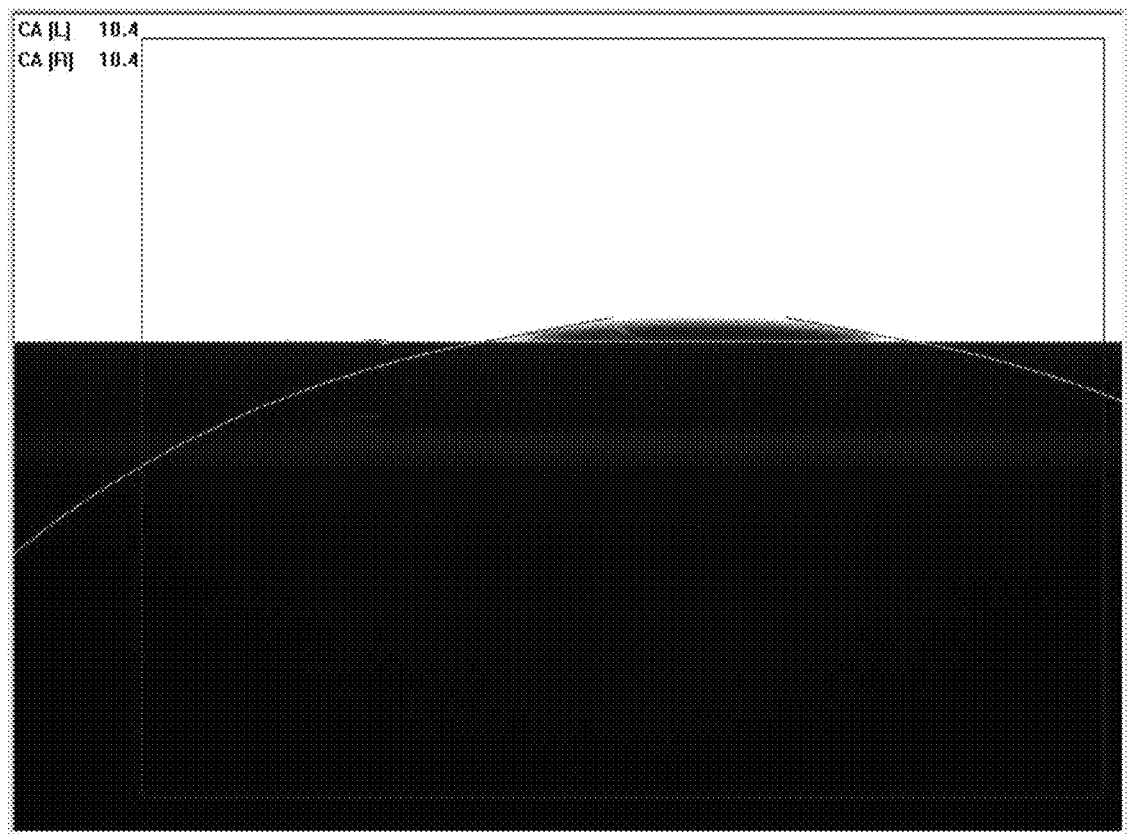
FIG. 17 is a drop shape analyzer illustration of the contact angle between a jet fuel droplet and conditioned Ti6Al4V specimen surface.
Figure 18:
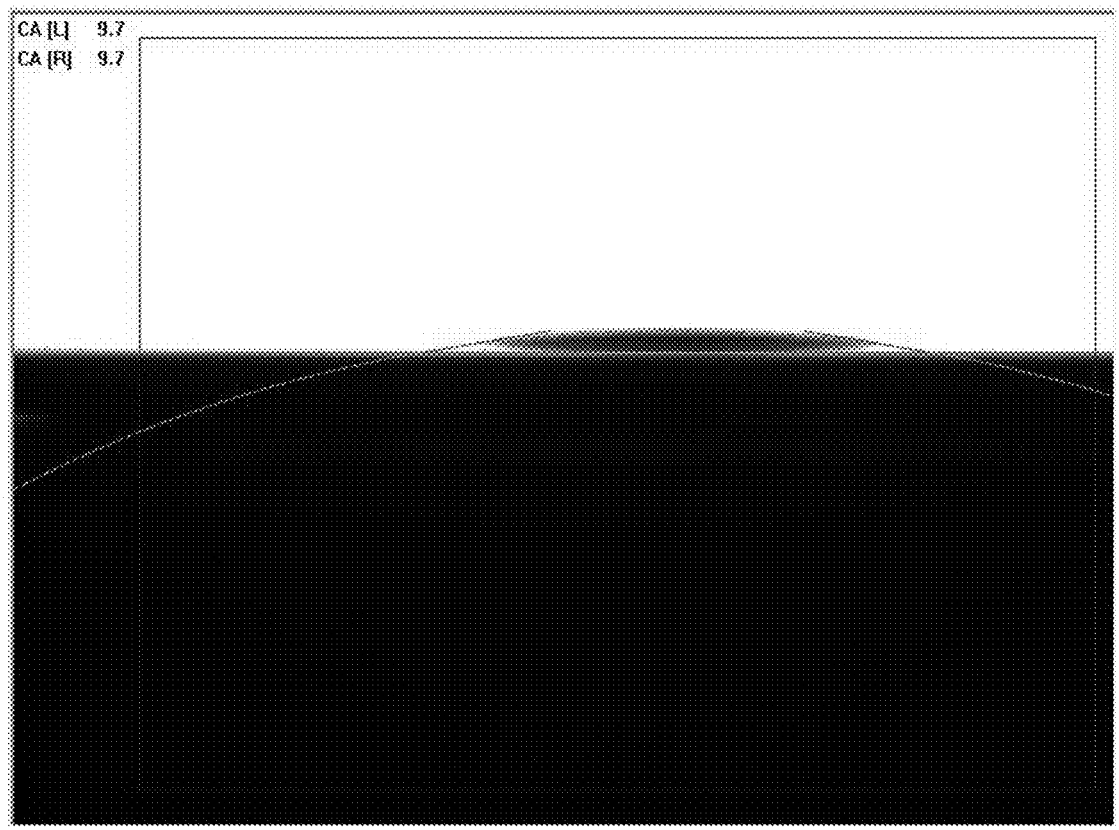
FIG. 18 is a drop shape analyzer illustration of the contact angle between a jet fuel droplet and conditioned, 100 nm metal oxide coated Ti6Al4V specimen surface.

The contact angle, in FIG. 16, between a jet fuel droplet and untreated Ti6Al4V specimen surface is equal 9.2°. Between fuel droplet and conditioned Ti6Al4V specimen surface, illustrated in FIG. 17 is equal 10.4°. In FIG. 18, the contact angle between fuel droplet and conditioned, 100 nm metal oxide coated Ti6Al4V specimen surface matches 9.7°.

Figure 19:
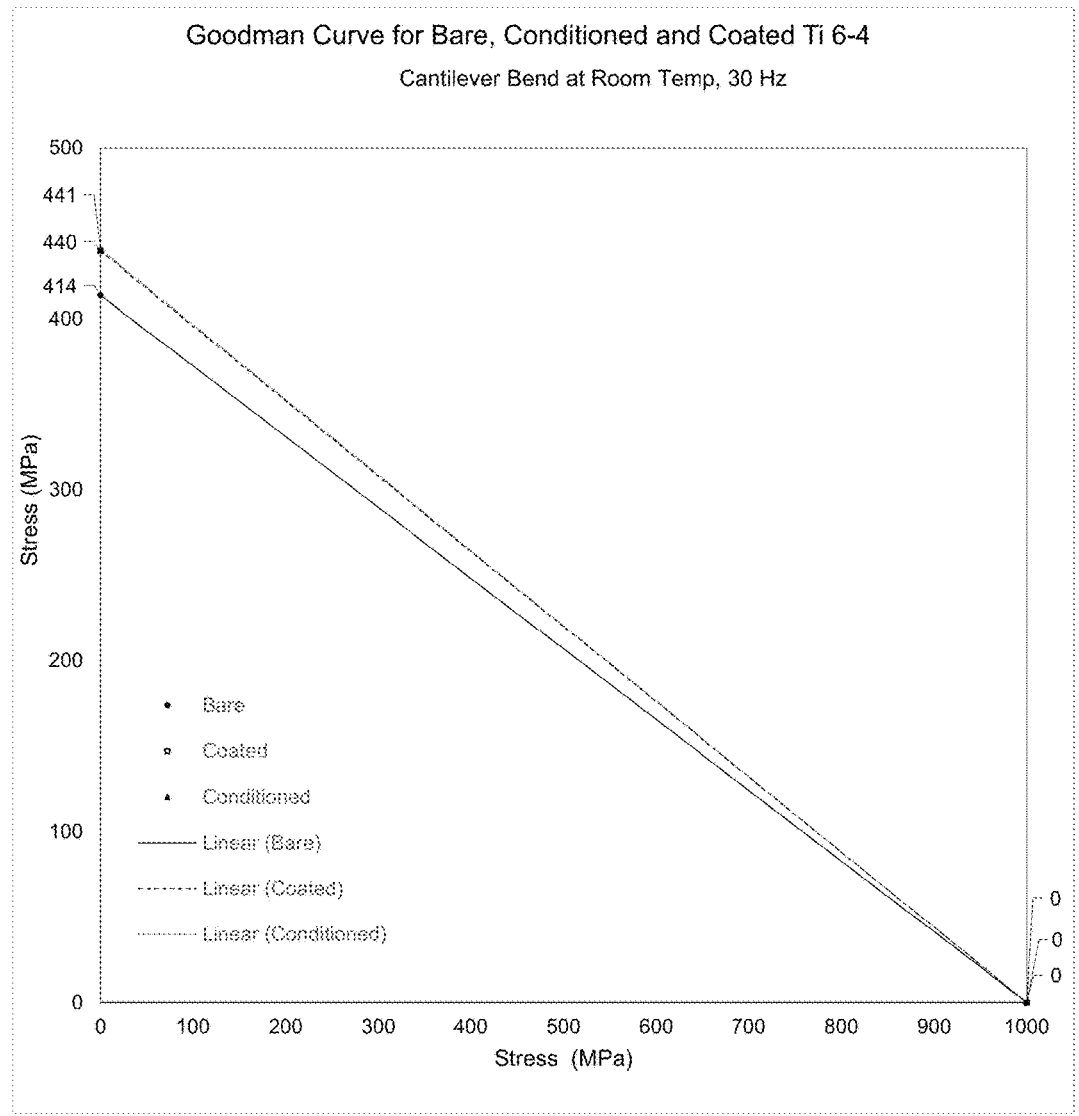
FIG. 19 is a Goodman Curve chart after high cycle fatigue test of conditioned Ti6Al4V specimens compared with bare and coated Ti6Al4V specimens.

Additional benefit of the invention is presented in FIG. 19 which illustrates high cycle fatigue test provided on Ti6Al4V specimens evidencing high cycle fatigue credit on the samples after the invented conditioning process.

It was concluded, from the investigation, that the conditioning method of blades and vanes not only enhanced the surface smoothness of the airfoils but also improves their durability and integrity, protects against fouling and extends their life.

The technology may be used in the turbine section where similar surface requirements apply.

What is claimed is:

1. A conditioning method of gas turbine engine components for aerodynamic noise reduction being provided by ion conditioning in physical vapor deposition process, after a two stage surface preparation including a traditional finishing process to smooth the surface until the surface roughness (Ra) reaches a maximum of 250 nanometers and a washing process. The ion conditioning process comprises all of the following intermediate stages:
   a glow discharge cleaning;
   an arc discharge cleaning;
   a direct smoothing;
   a surface glancing; and
   a surface relaxation;
to reach a surface roughness (Ra) below 150 nanometers resulting in conditioned components.

2. A conditioning method of gas turbine engine components for aerodynamic noise reduction being provided by ion conditioning in physical vapor deposition process, after two stage surface preparation including a traditional finishing process to smooth the surface until the surface roughness (Ra) reaches a maximum 250 nanometers and a washing process. The ion conditioning process comprises at least three of the following intermediate stages and performed not in the presented order:
   a glow discharge cleaning;
   an arc discharge cleaning;
   a direct smoothing;
   a surface glancing; and
   a surface relaxation;
to reach a surface roughness (Ra) below 150 nanometers resulting in conditioned components.

3. The conditioning method of gas turbine engine components for aerodynamic noise reduction according to claim 1 further comprising of each of the conditioned components providing a hard film protective coating selected from four groups consisting of oxides, nitrides, carbides or carbo-nitrides from which aluminum, chromium, titanium or zirconium are applied to a thickness up to 3000 nanometers.

4. The conditioning method of gas turbine engine components for aerodynamic noise reduction according to claim 1 further comprising of each of the conditioned components providing a hard film multilayer protective coating having at least one layer selected from four groups consisting of oxides, nitrides, carbides or carbo-nitrides from which aluminum, chromium, titanium or zirconium are applied to a thickness up to 3000 nanometers.

5. The conditioning method of gas turbine engine components for aerodynamic noise reduction according to claim 1 further comprising of each of the conditioned components providing any type of hard film coatings having a thickness up to 3000 nanometers.

6. The conditioning method of gas turbine engine components for aerodynamic noise reduction according to claim 1 further comprising of each of the conditioned components providing any type of hard film.

7. The conditioning method of gas turbine engine components for aerodynamic noise reduction according to claim 1 provided on gas turbine engine components coated with any type of hard film as an interlayer conditioning.

8. The conditioning method of gas turbine engine components for aerodynamic noise reduction according to claim 2 further comprising of each of the conditioned components providing a hard film protective coating selected from four groups consisting of oxides, nitrides, carbides or carbo-nitrides from which aluminum, chromium, titanium or zirconium are applied to a thickness up to 3000 nanometers.

9. The conditioning method of gas turbine engine components for aerodynamic noise reduction according to claim 2 further comprising of each of the conditioned components providing a hard film multilayer protective coating having at least one layer selected from four groups consisting of oxides, nitrides, carbides or carbo-nitrides from which aluminum, chromium, titanium or zirconium are applied to a thickness up to 3000 nanometers.

10. The conditioning method of gas turbine engine components for aerodynamic noise reduction according to claim 2 further comprising of each of the conditioned components providing any type of hard film coatings having a thickness up to 3000 nanometers.

11. The conditioning method of gas turbine engine components for aerodynamic noise reduction according to claim 2 further comprising of each of the conditioned components providing any type of hard film.

12. The conditioning method of gas turbine engine components for aerodynamic noise reduction according to claim 2 provided on gas turbine engine components coated with any type of hard film as an interlayer conditioning.

* * * * *